United States Patent

Kyougoku et al.

[11] Patent Number: 5,995,379
[45] Date of Patent: Nov. 30, 1999

[54] STACKED MODULE AND SUBSTRATE THEREFORE

[75] Inventors: Yoshitaka Kyougoku; Kazuhiko Ohkubo, both of Tokyo, Japan

[73] Assignee: NEC Corporation, Tokyo, Japan

[21] Appl. No.: 09/177,384

[22] Filed: Oct. 23, 1998

[30] Foreign Application Priority Data

Oct. 30, 1997 [JP] Japan .................... 9-298909

[51] Int. Cl.⁶ .............. H05K 1/11; G11C 5/06
[52] U.S. Cl. ............. 361/803; 257/686; 365/51
[58] Field of Search ............. 361/767, 768, 361/784, 803; 257/685, 686, 723, 724, 786, 777; 365/51, 52, 63

[56] References Cited

U.S. PATENT DOCUMENTS

| | | | |
|---|---|---|---|
| 5,130,894 | 7/1992 | Miller | 361/803 |
| 5,198,888 | 3/1993 | Sugano et al. | 257/686 |
| 5,343,075 | 8/1994 | Nishino | 257/686 |
| 5,397,916 | 3/1995 | Normington | 257/686 |
| 5,434,452 | 7/1995 | Higgins, III | 257/773 |
| 5,434,745 | 7/1995 | Shokrgozar et al. | 257/777 |
| 5,585,675 | 12/1996 | Knopf | 257/686 |
| 5,854,507 | 12/1998 | Miremadi et al. | 257/686 |

FOREIGN PATENT DOCUMENTS 8-236694  9/1996  Japan .

*Primary Examiner*—Donald Sparks
*Assistant Examiner*—John B. Vigushin
*Attorney, Agent, or Firm*—Whitham, Curtis & Whitham

[57] ABSTRACT

Substrates 1, 2 include chip select electrode pads B1, B2, C1, C2, and first chip select electrode pads B1, C1 are connected to chip select terminals of semiconductor chips 3, 4. The other chip select electrodes B2, C2 are connected to opposite surface side electrodes B1', C1' positioned on the opposite surface side of the chip select electrodes B1, C1 adjacent in the direction of the first chip select electrodes. The opposite surface side electrode B1 and the chip select electrode C1 of the substrate confronted therewith are connected to each other by a conductive bump 6. Thus, the substrates 1, 2 have the same structure.

11 Claims, 14 Drawing Sheets

STACKED MODULE AND SUBSTRATE THEREFORE

BACKGROUND OF THE INVENTION

1. Field of the Invention

This invention relates to a packaging structure in which a semiconductor device such as a memory or the like is used, and particularly to a stacked module formed by stacking semiconductor devices and connecting them and substrates used for the stacked module, in which a semiconductor device is mounted on the surface thereof, to be stacked.

2. Description of the Related Art

A known packaging method for a semiconductor device is that a semiconductor device is mounted on a substrate, the substrates are stacked in plural layers to construct a stacked module, and the module is mounted on a motherboard. This packaging for a semiconductor device by the stacked module is effective for reducing the packaging area.

The stacked module using a substrate is effectively utilized for packaging a semiconductor chip such as a semiconductor memory or the like. For example, the case of packaging dynamic RAMs (DRAM) 80, 81 of a memory circuit shown in FIG. 10 will be described. In FIG. 10, the external terminals of the DRAM 80, 81 are all shared except RAS (Row Address Strobe). The terminals 82, 83 connected to RAS are separately used for chip select. Chip select may be performed not by RAS, but by CAS (Column Address Strobe).

In FIG. 10, terminals other than a chip select terminal for determining which DRAMs 80, 81 is operated are shared, thus in the case of wiring packaging, substrates on which DRAMs are mounted can be stacked.

The stacked module is, for example, as described in Japan Patent Laid-Open No. 8-236694, such that a plurality of substrates (carrier) where a semiconductor chip (LSI chip) is mounted facedown are stacked and connection between the substrates is performed by metallic pins or conductive bumps.

FIG. 11 is a perspective view showing this type of a stacked module using conductive bumps. The stacked module of FIG. 11 is equivalent to a memory circuit of FIG. 10. In FIG. 11, semiconductor chips 3, 4 are respectively chips of DRAMs 80, 81 of FIG. 10.

The semiconductor chips 3, 4 are mounted facedown on substrates 100, 101. The matrix of the substrates 100, 101 is formed by an insulator such as ceramics, glass or the like. A conductive bump 5 is mounted on each electrode pad of the substrate 100, a conductive bump 6 is mounted on each electrode pad of the substrate 101, and the respective electrode pads are wired to terminals (not shown) of the semiconductor chips 3, 4. Connection between the substrates 100, 101 is performed through the conductive bumps 6. The conductive bumps 5 are served as external terminals at the time of connecting the stacked module of FIG. 11 facedown to a motherboard not shown.

FIG. 12A shows the upper substrate 100 where the semiconductor chip 3 is mounted, FIG. 12B shows the lower substrate 101 where the semiconductor chip 4 is mounted, and they are plan views respectively showing the condition before the conductive bumps 5, 6 are mounted.

Electrode pads 111 to 134 connected to the terminal (not shown) of the semiconductor device 3, on which the conductive bumps 5 are mounted, through hole electrode pads B111 to B134 connected to the electrode pads 111 to 134, and wirings for connecting the respective through hole electrode pads and the terminals of the semiconductor device 3 to each other are formed on the surface of the substrate 100.

On the other hand, electrode pads 141 to 164 connected to the terminals (not shown) of the semiconductor device 4, on which the conductive bumps 6 of FIG. 11 are mounted, through-hole electrode pads C111 to C134 connected to the electrode pads 141 to 164, and wiring for connecting the respective through-hole electrode pads and the terminals of the semiconductor device 4 to each other are formed on the surface of the substrate 101. The reason why the electrode pads on which the conductive bumps 5, 6 are placed are separate from the through-hole electrodes is that the conductive bumps such as solder bumps or the like are prevented from being absorbed in the through-holes.

The through-hole electrode pads B111 to B134 and C111 to C134 of FIGS. 12A and 12B are electrically connected to the through-hole electrode pads B111' to B134' and C111' to C134' (only reference numerals, not shown) formed on the back of the substrates 100 and 101 through through-holes. The same electrode pads 111' to 134' and 141' to 164' (only reference numerals, not shown) are formed on the back side of the substrates 100 and 101 of the electrode pads 111 to 134 and 141 to 164.

The electrode pads 111' to 134' on the back side of the substrate 100 are respectively connected to the through-hole electrode pads B111' to B134' on the same back side, and the electrode pads 141' to 164' of the back side of the substrate 101 are respectively connected to the through-hole electrode pads C111' to C134' on the back side.

Thus, the electrode pads and the through-hole electrodes are formed in pair on the surface side and back side of the substrates 100, 101, whereby the electrode patterns are made uniform so as to improve productivity in pattern printing.

The conductive bumps 6 directly connect the electrode pads 141 to 164 on the surface side of the lower substrate 101 and the electrode pads 111' to 134' on the back side of the upper substrate 100 to each other. The condition of the connection is shown in FIGS. 13 and 14.

FIGS. 13 is a perspective view of a J-part of FIG. 11 to an enlarged scale, and FIG. 14 is a sectional view taken along line G—G of FIG. 11. As shown in FIGS. 13 and 14, the through electrode pads B111 and B111', B112 and B112', C111 and C111', C112 and C112' are respectively connected to each other by through-hole internal electrodes S31, S32, S33, S34. The conductive bumps 6, as shown in FIG. 13, directly connect the electrode pads 111', 112' on the back side of the upper substrate 100 to the electrode pads 141, 142 on the surface side of the lower substrate 101 to each other. The connection form of the other electrode pad part is also similar to FIGS. 13 and 14. As the result, the respective electrode pads of the substrates 100, 101 are directly connected to each other vertically through the conductive bumps 6.

As described above, the semiconductor devices 3 and 4 are vertically direct-coupled to each other through the conductive bumps 6 to be connected, and mounted facedown on a motherboard not shown through the conductive bumps 5.

Again in FIGS. 12A and 12B, connection for chip select is a wiring part between the RAS terminal of the semiconductor chip 3 and the electrode pads 111, 112, and between the RAS terminal of the semiconductor chip 4 and the electrode pads 141, 142 (through hole electrode pads B111, B112, C111, C112). However, the connection pattern for chip select differs with the substrates of the respective layers.

In the case of selecting the semiconductor chip 3 at the time of reading and writing data, as shown in FIG. 12A, a chip select signal is supplied to the electrode pad connected to the RAS of the semiconductor chip 3. At this time, the chip select signal is transmitted to the electrode pad 142, but this is not connected to the RAS, so that the semiconductor device 4 is not selected. On the other hand, in the case of selecting the semiconductor chip 4 at the time of reading and writing, a chip select signal is supplied to the electrode pad 111 connected to the RAS of the semiconductor chip 4. Thus, selection from the semiconductor devices 3 and 4 is enabled by supplying a chip select signal one of the electrode pads 111, 112 of the substrate 100.

In the described conventional stacked module, chip select is enabled by changing wiring for chip select at every stage of the substrates. Hence it is necessary to use different substrates in the respective layers in the stacked module.

That is, it is necessary to manufacture substrates with plural wiring patterns, so that productivity is low and the yield is bad. Further, when the arrangement of substrates in the stacked module is wrong, it is necessary to replace the whole of the stacked module.

SUMMARY OF THE INVENTION

Accordingly it is the object of the invention to provide a substrate and a stacked module in which the described problems are solved by making the wiring part for chip select in common.

A stacked module of the present invention is a stacked module constructed so that substrates on which a semiconductor device having a chip select terminal to be selected according to an external signal is mounted are stacked in N-layer (N is integers from 2 up) and the upper and lower terminals are connected to each other. All of the substrates (1, 2 in FIG. 3 and FIG. 6) have the same wiring structure. Each substrate (1 in FIG. 3 and FIG. 6) has N-number of chip select electrodes (B1 and 11, B2 and 12 in FIG. 3 and FIG. 6) arranged adjacent to each other, first chip select electrodes (B1 and 11, C1 and 41 in FIG. 3 and FIG. 6) among N-number of chip select electrodes are connected to the chip select terminal of a mounted semiconductor device (3 in FIG. 1), and the other chip select electrodes (B2 and 12 of FIG. 3 and FIG. 6) are connected to opposite surface side electrodes (B1' and 11' in FIG. 3, 11' in FIG. 6) positioned on the opposite surface side of the adjacent chip select electrode in the direction of the first chip select electrode. The opposite surface side electrodes and the chip select electrodes (C1 and 41 in FIG. 3 and FIG. 6) of the substrate (2 in FIG. 3 and FIG. 6) confronting therewith are connected to each other by conductive bumps (6 in FIG. 3 and FIG. 6).

Thus, substrates in common can be used all in N-number of layers so as to improve productivity, and even if the upper and lower positional relationship of the substrates is mistaken, there is no obstacle.

In the described invention, to simplify wiring, the first chip select electrode is positioned at the endmost of N-number of chip select electrodes.

The other chip select electrodes and the opposite surface side electrodes positioned on the opposite surface side of the adjacent chip select electrode in the direction of the chip select electrode are, to be concrete, connected to each other by conductors (L1, S1, S2 in FIG. 3) arranged in the interior of the substrate.

According to the present invention, a stacked module, in which first and second substrates are stacked and upper and lower terminals are connected to each other, is characterized in that the first and second substrates (1, 2 in FIG. 6) have the same wiring structure, the first substrate (1 in FIG. 6) has chip select electrodes (B1 and 11, B2 and 12) arranged adjacent to each other, one side chip select electrodes (B1 and 11) are connected to chip select terminals of a mounted semiconductor device (3 in FIG. 1), the other side chip select electrodes (B2, 12 and S10 in FIG. 6) are pierced through the first substrate to reach the opposite surface side and then connected to the opposite surface side electrodes (11' in FIG. 6) positioned on the opposite surface side of one side chip select electrodes through a conductor (L10 in FIG. 6), and the opposite surface side electrodes and the chip select electrodes (C1 and 41 in FIG. 6) of the second substrate (2 in FIG. 6) confronting therewith are connected to each other by a conductive bump (6 in FIG. 6).

As a conductor is not formed in the interior of the substrate in the described stacked module, it is not necessary to construct the substrate in multi-layer, resulting in the advantage that the substrate can be manufactured at a low cost and the thickness is not increased.

The substrate of the present invention includes N-number (N is integers from 2 up) of chip select electrodes arranged adjacent to each other, wherein a first chip select electrode positioned at the endmost of the N-number of chip select electrodes is connected to the chip select terminal of the semiconductor device, and the other chip select electrode is connected to the opposite surface side electrode positioned on the opposite surface side of the adjacent chip select electrode in the direction of the first chip select electrode.

DETAILED DESCRIPTION OF THE PREFERRED EMBODIMENTS

Figure 1:
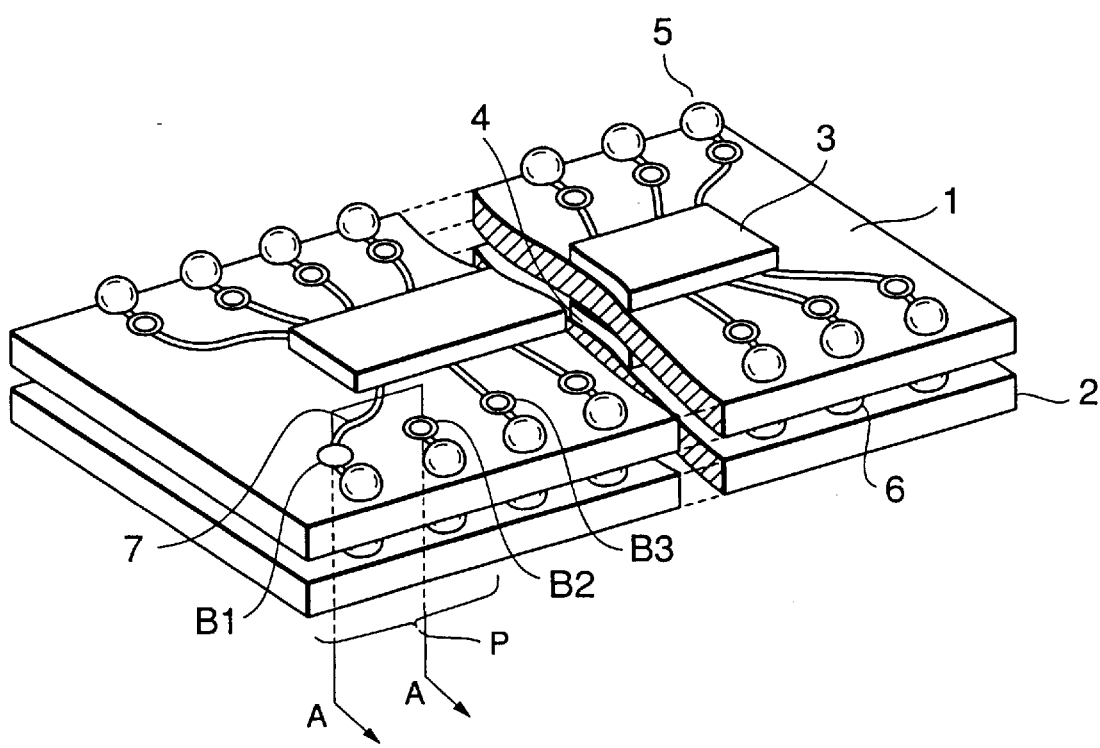
FIG. 1 is a perspective view, with portions broken away, showing a first embodiment of a stacked module according to the present invention.
Figure 10:
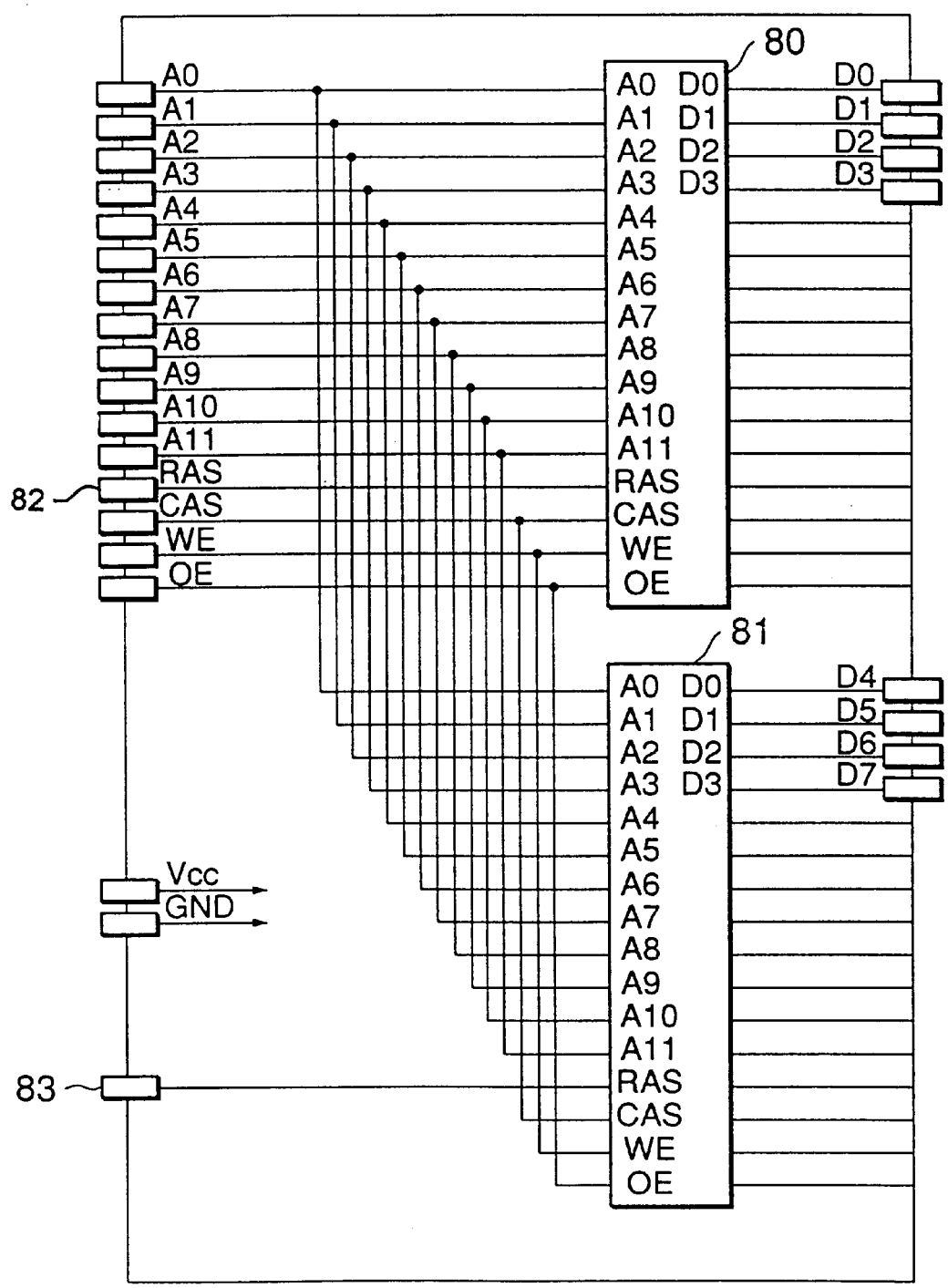
FIG. 10 is a circuit diagram of a memory circuit using DRAM.
Figure 11:
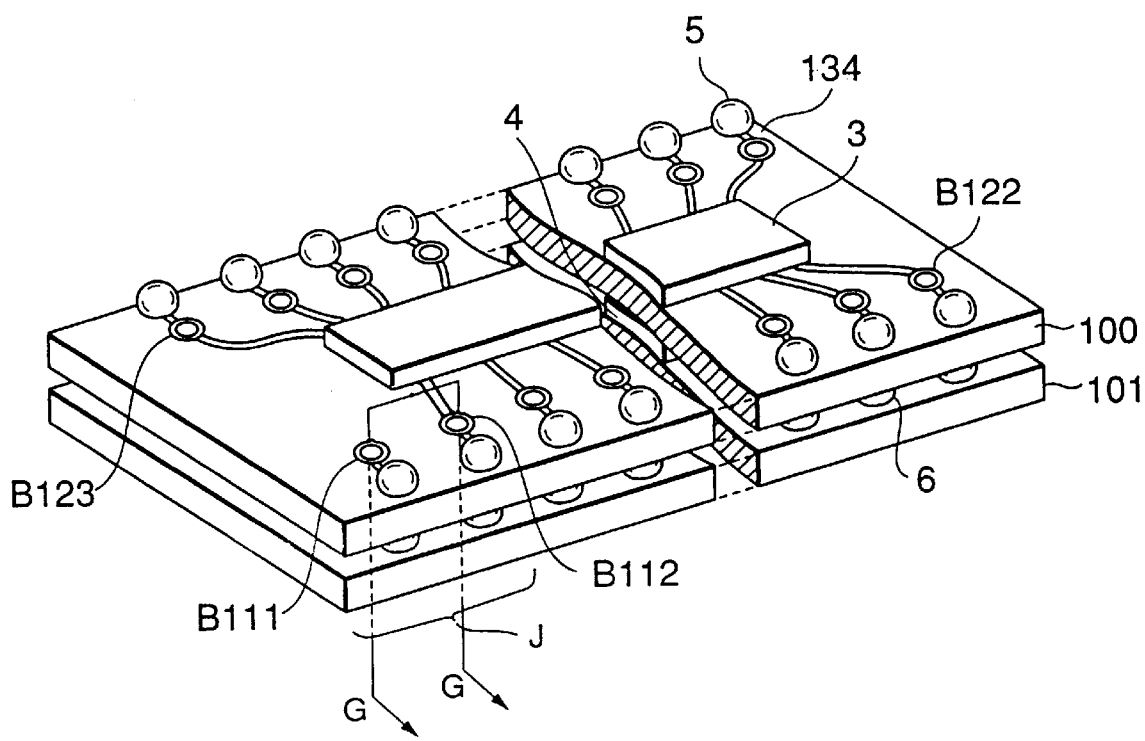
FIG. 11 is a perspective view, with portions broken away, showing the conventional stacked module.
Figure 12A:
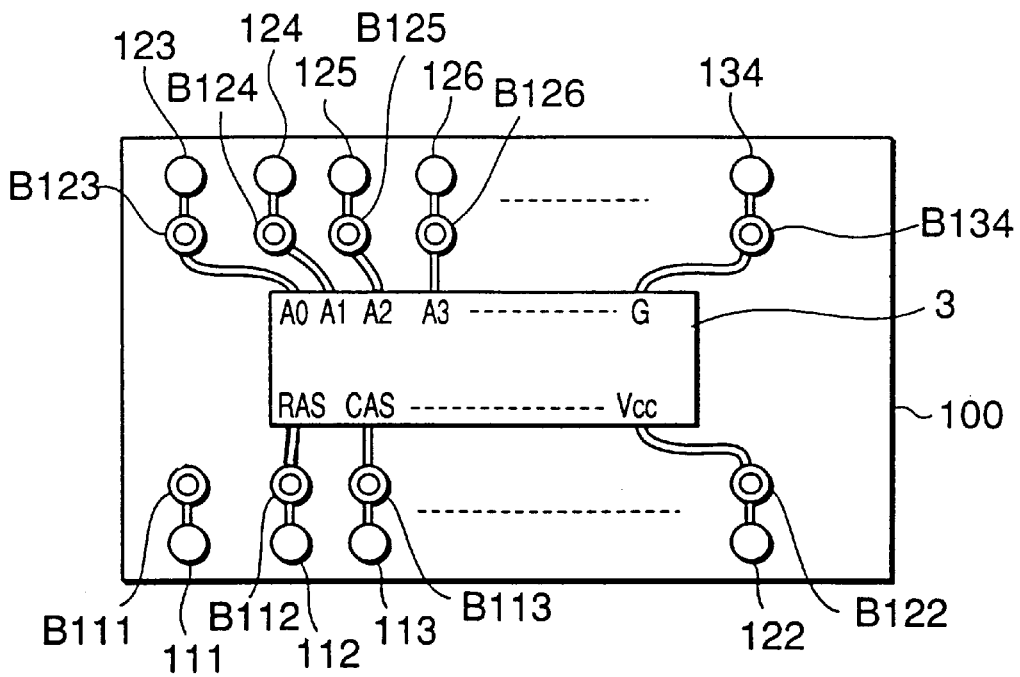
FIG. 12A is a plan view showing an upper substrate of the stacked module shown in FIG. 11.
Figure 12B:
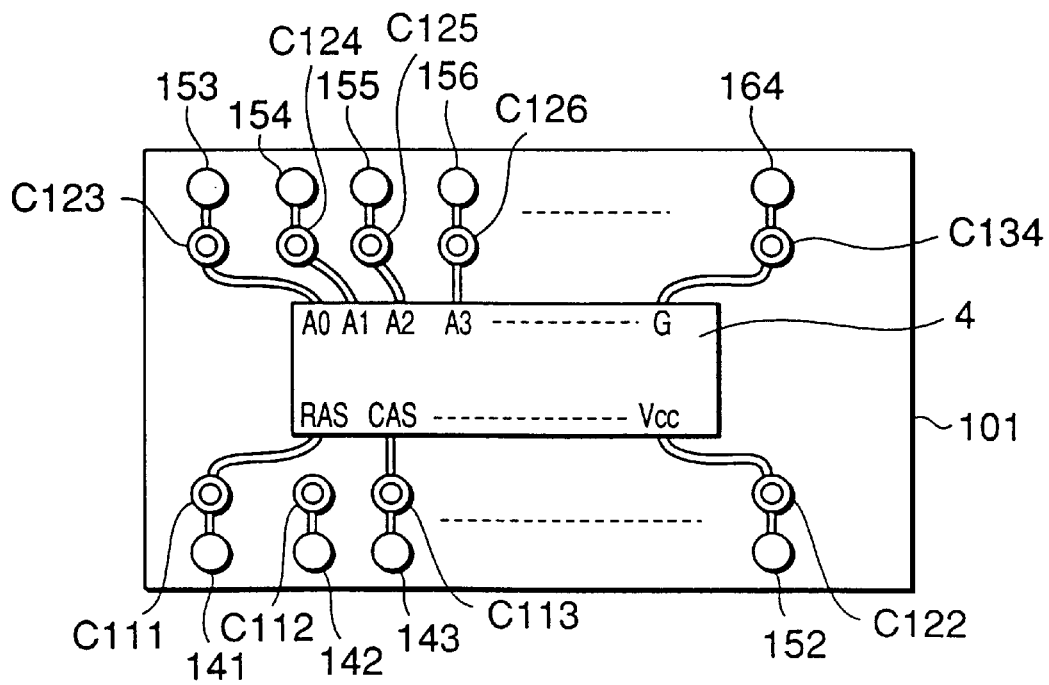
FIG. 12B is a plan view showing a lower substrate.
Figure 13:
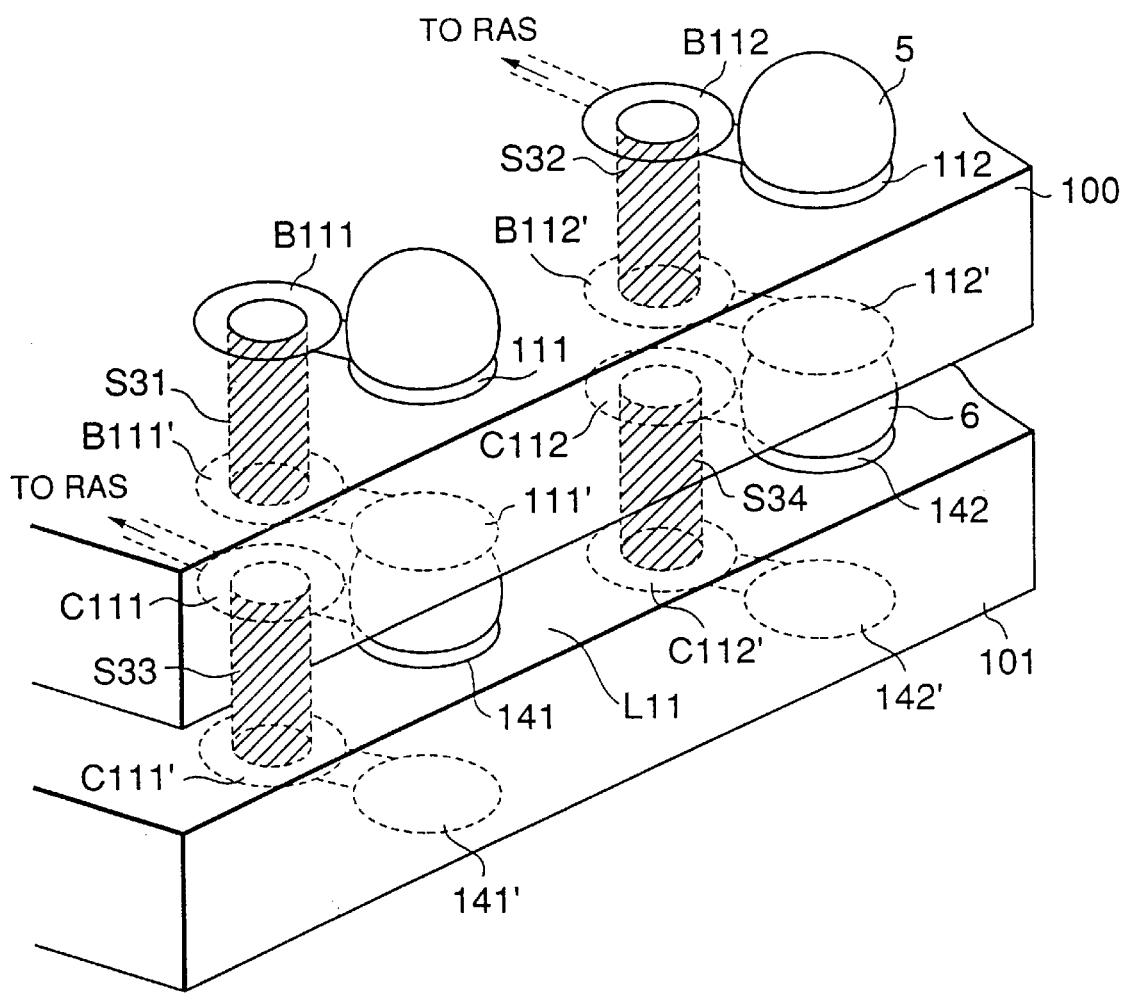
FIG. 13 is a perspective view of a part J in FIG. 11 to an enlarged scale.
Figure 14:
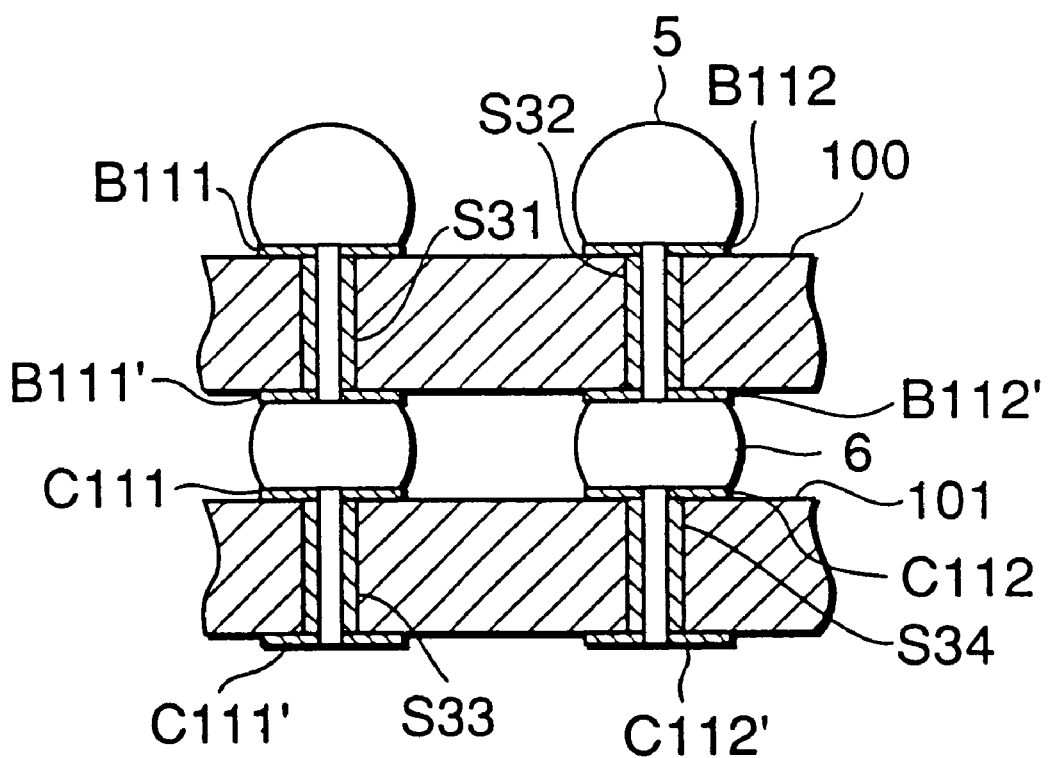
FIG. 14 is a sectional view taken along line G—G of FIG. 11.

FIG. 1 is a perspective view, with portions broken away, showing a first embodiment of a stacked module according to the present invention. The stacked module of FIG. 1 is equivalent to a memory circuit. In FIG. 1, semiconductor chips 3, 4 are respectively DRAM chips of DRAM 80, 81 of FIG. 10.

The semiconductor chips 3, 4 are mounted facedown on substrates 1, 2. The matrices of the substrates 1, 2 are formed by an insulator such as ceramics or glass. A conductive bump 5 such as a solder bump is formed on each electrode pad of the substrate 1, a conductive bump 6 such as a solder bump or the like is formed on each electrode pad of the substrate 2, and connection between the substrates is performed through the conductive bump 6. The conductive bump 5 serves as an external terminal at the time of mounting the stacked module of FIG. 1 facedown on a motherboard not shown. The number of external terminals is twenty four.

Figure 2A:
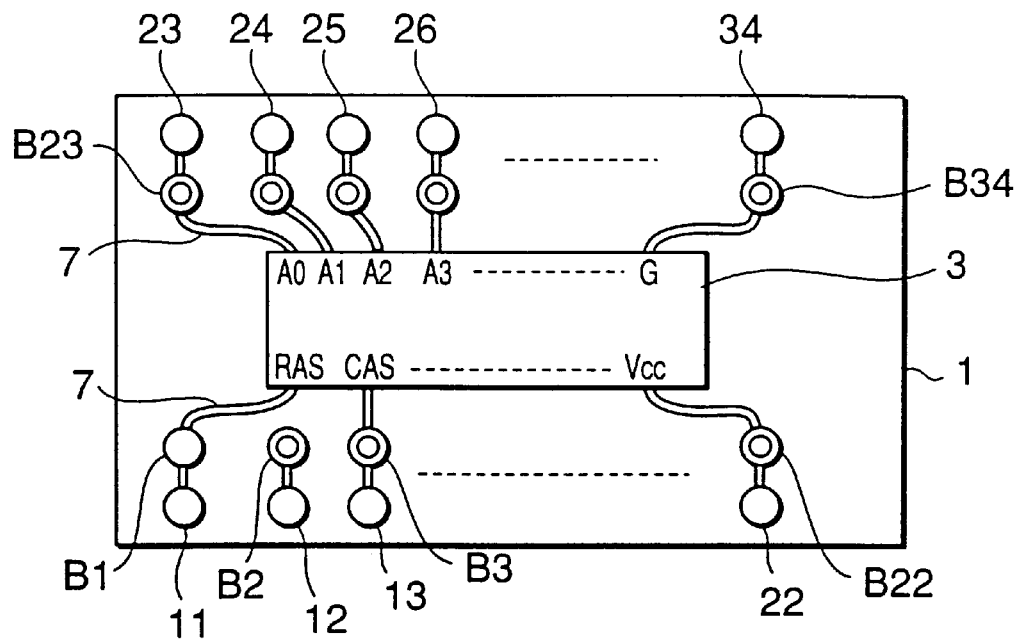
FIG. 2A is a plan view showing an upper substrate of the stacked module shown in FIG. 1.
Figure 2B:
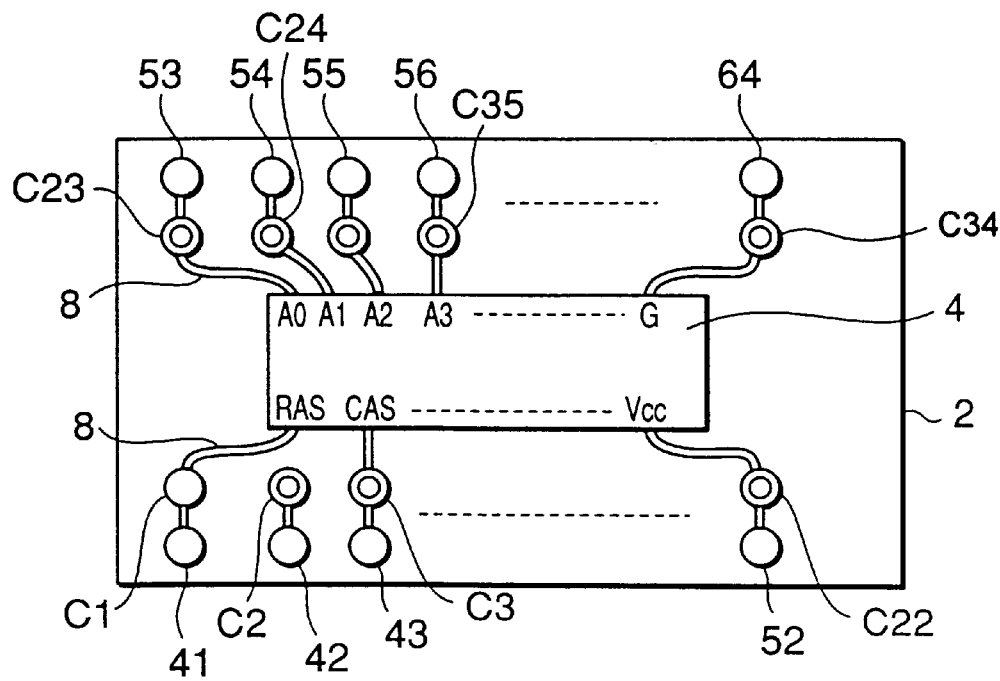
FIG. 2B is a plan view showing a lower substrate.

FIG. 2A shows the upper substrate 1 on which the semiconductor chip 3 is mounted, FIG. 2B shows the lower substrate 2 on which the semiconductor chip 4 is mounted, and they are plan views respectively showing the condition before the conductive bumps 5, 6 are mounted. The substrates 1 and 2 have the same wiring structure.

In FIG. 2A, on the surface of the substrate 1, formed are 24 electrode pads 11 to 34 connected to the terminal (not shown) of the semiconductor chip 3, on which the conductive bump 5 of FIG. 1 is mounted, chip select electrode pads B1, B2 connected to the electrode pads 11, 12, through-hole electrode pads B3 to B34 connected to the electrode pads 13 to 34, and wirings 7 for connecting the chip select electrode pads B1, B2, and the through-hole electrode pads B3 to B34 to the respective terminals of the semiconductor chip 3.

On the other hand, in FIG. 2B, on the surface of the substrate 2, formed are 24 electrode pads 41 to 64 connected to the terminal (not shown) of the semiconductor chip 4, on which the conductive bump 6 of FIG. 1 is mounted, chip select electrode pads C1, C2 connected to the electrode pads 41, 42, through-hole electrode pads C3 to C34 connected to the electrode pads 43 to 64, and wirings 8 for connecting the chip select electrode pads C1, C2 and the respective through-hole electrode pads to the respective terminals of the semiconductor chip 4.

The electrode pads 11, 12 (B1, B2) and the electrode pads 41, 42 (C1, C2) of the substrates 1, 2 are the electrode pads for chip select of the semiconductor chips 3, 4, and the other electrode pads 13 to 34 and electrode pads 43 to 64 are connected to terminals other than the chip select terminals and also connected to each other at the time of stacking and packaging. The electrode pad 12 (B2) is not connected to the semiconductor chip 3, and the electrode pad 42 (C2) is not connected to the semiconductor chip 4.

The reason why electrode pads for placing the conductive bumps 5, 6 thereon are provided separately from the conductive pads B1 to B34, C1 to C34 is to improve placing of the conductive bumps such as solder bumps or the like.

In FIGS. 2A and 2B, the through-hole electrode pads B3 to B34 and the through-hole electrode pads C3 to C34 are electrically connected to through-hole electrode pads B3' to B34' and C3' to C34' (only reference numerals, not shown) formed on the back sides of the substrates 1, 2 through through-holes. Further, the same electrode pads 11' to 34' and 41' to 64' (only reference numerals, not shown) are formed on the back sides of the substrates 1, 2 of the electrode pads 11 to 34 and 41 to 64 on which the conductive bumps 5, 6 are placed.

The electrode pads 11' to 34' on the back side of the substrate 1 are respectively connected to the chip select electrode pads B1', B2' and the through-hole electrode pads B3' to B34' on the same back side similarly to the surface side, and also the electrode pads 41' to 64' on the back side of the substrate 2 are respectively connected to the chip select electrode pads C1', C2' and the through-hole electrode pads C3' to C34' on the same back side. Thus, the electrode pads and the through-hole electrodes are formed in pair on the surface sides and the back sides of the substrates 1, 2, whereby the substrates may be used in any layer of the stacked module.

The conductive bumps 6 respectively connect the electrode pads 41 to 64 of the surface side of the lower substrate 2 and the electrode pads 11' to 34' of the back side of the upper substrate 1 directly to each other. Thus, the connection between the semiconductor chips 3 and 4 through the conductive bumps 6 is enabled.

In the present embodiment, to let the substrates 1, 2 have the same wiring structure, means are formed in the lower inner layers of the chip select electrode pads B1, B2 and the chip select electrode pads C1, C2 of the semiconductor chips 3, 4. On the lower sides of the chip select electrode pads B1, B2 and C1, C2, characteristic wiring structure is provided for realizing chip select of the semiconductor chips 3, 4. The details of the wiring structure are shown in FIGS. 3 and 4.

Figure 3:
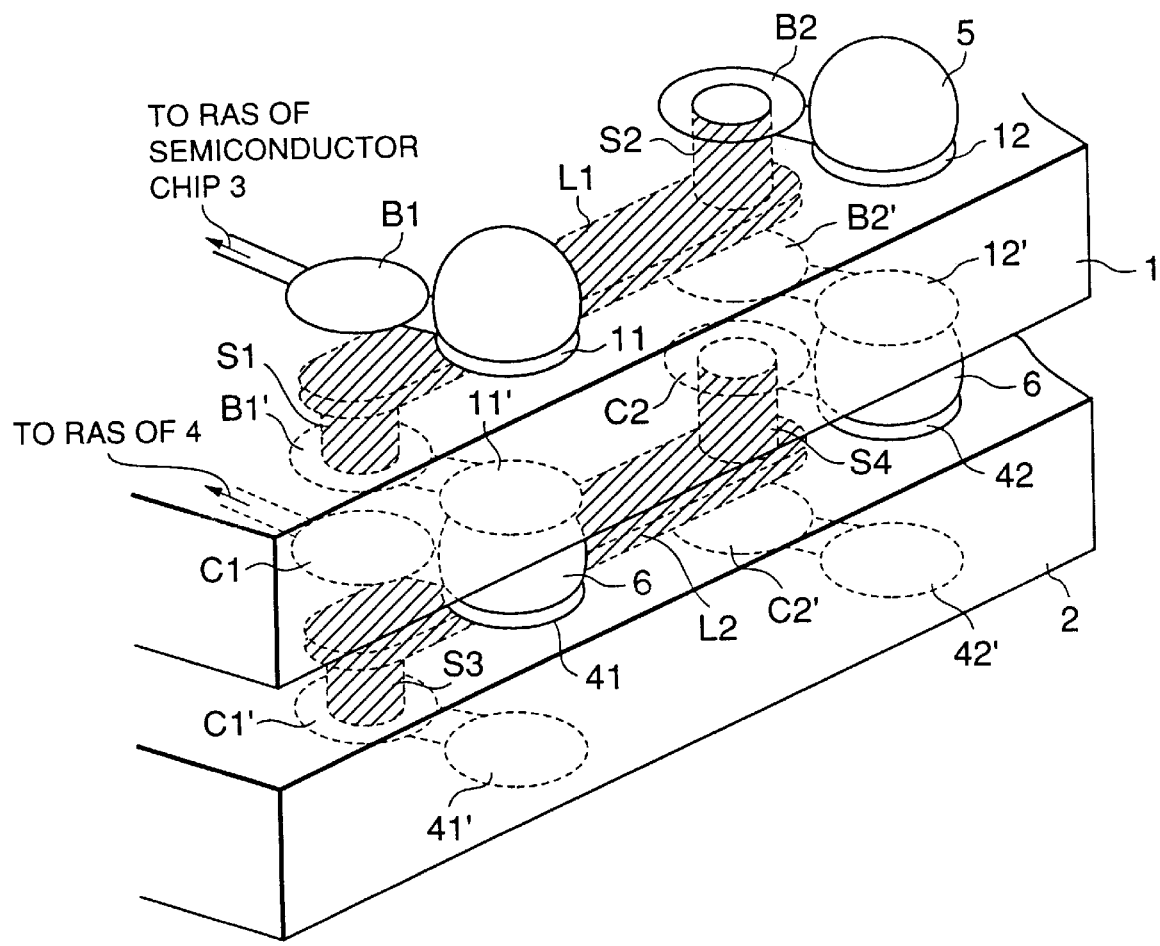
FIG. 3 is a perspective view of a part P in FIG. 1 to an enlarged scale.
Figure 4:
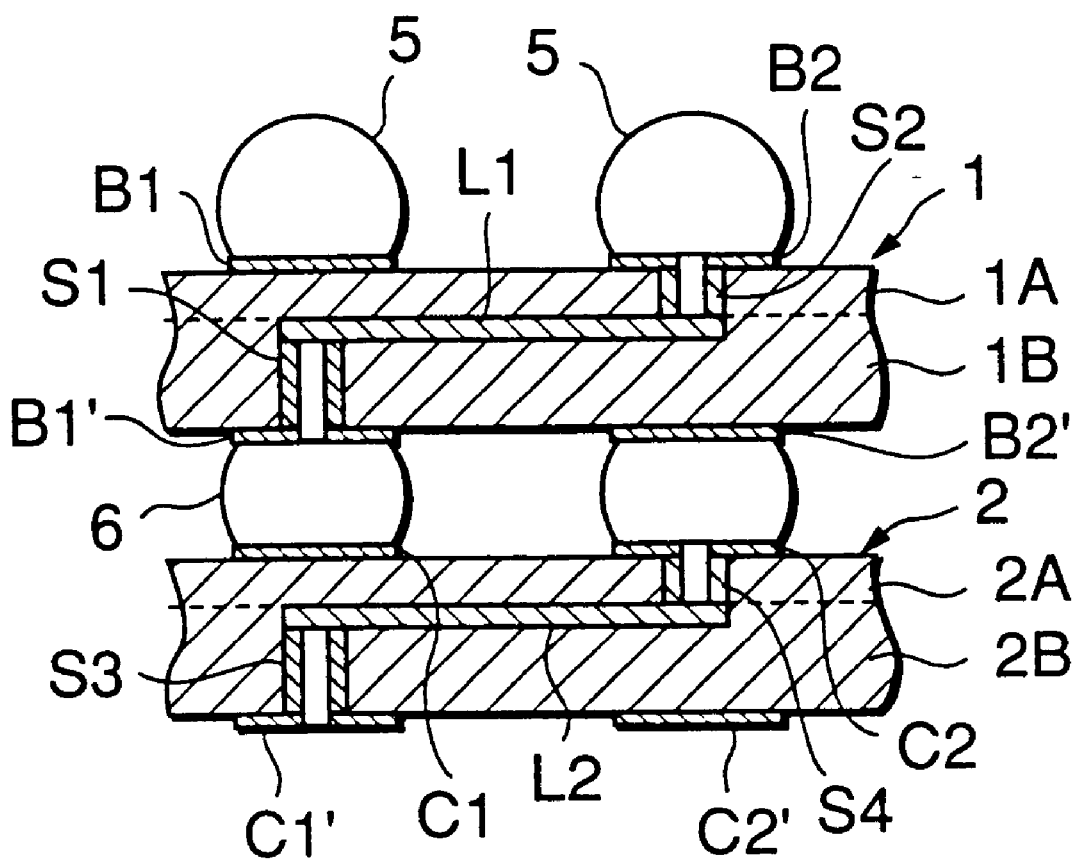
FIG. 4 is a sectional view taken along line A—A of FIG. 1.

FIG. 3 is a perspective view of a part P in FIG. 1 to an enlarged scale, and FIG. 4 is a sectional view taken along line A—A of FIG. 1. As shown in FIGS. 3 and 4, the chip select electrode pad B2 of the substrate 1 and the electrode pad B1' on the back side of the adjacent chip select electrode pad B1 are connected to each other inside the substrate 1, and the chip select electrode pad C2 of the substrate 2 and the electrode pad C1' on the back side of the adjacent chip select electrode pad C1 are connected to each other inside the substrate 2.

To be more in detail, in FIG. 3, the chip select electrode pad B2 is connected to the back side electrode pad B1' through a via hole internal electrode S2, an internal conductive layer L1, and a via hole internal electrode S1, and further connected from the electrode pad 11' through the conductive bump 6 to the chip select electrode pad C1. The chip select electrode pad C1 is connected to the RAS terminal of the semiconductor device 4 mounted on the lower substrate 2, so that a chip select signal supplied to the chip select electrode pad B2 is supplied to the terminal of RAS of the semiconductor chip 4 to be selected.

The chip select electrode pad B1 is independent of the electrode pad B2.

Hence, the electrode pad 11 (and B1) of the upper substrate 1 serving as a connecting terminal to a motherboard is connected to the RAS terminal of the semiconductor chip 3, so that chip select for the semiconductor chip 3 is performed by the electrode pad 11.

Thus, the chip select electrode pads B1 and B2 (electrode pads 11 and 12) are utilized as a terminal for performing chip select for the semiconductor chips 3, 4.

The same wiring structure as that of the substrate 1 is formed also in the inside of the substrate 2. That is, the chip select electrode C2 is connected to the electrode pad C1' and the electrode pad 41' on the back side through a via hole internal electrode S4, an internal conductive layer L2, and a via hole internal electrode S3. The chip select electrode pad C1 is independent of the electrode pad C2. However, in the first embodiment, the internal wiring of substrate 2 and the electrode pad C2 are unused wiring.

As shown in FIG. 4, the substrate 1 includes a two-layer structure of a first layer 1A and a second layer 1B. In the first layer 1A, after boring, a via hole internal electrode S2 is formed, and in the second layer 1B, after boring, a via hole internal electrode S1 is formed, and further an internal conductive layer L1 is formed.

The substrate 2 is also obtained by forming a first layer 2A and a second layer 2B and stacking the same to each other by the same method as the substrate 1.

As described above, in the first embodiment, the substrates 1 and 2 have the quite same wiring structure, so that the productivity is high and the yield is improved. Further, even if the positions of the substrates 1, 2 are inverted, the function will not be changed. Hence, it is not necessary to replace a stacked module so as to improve the economical efficiency.

Figure 5:
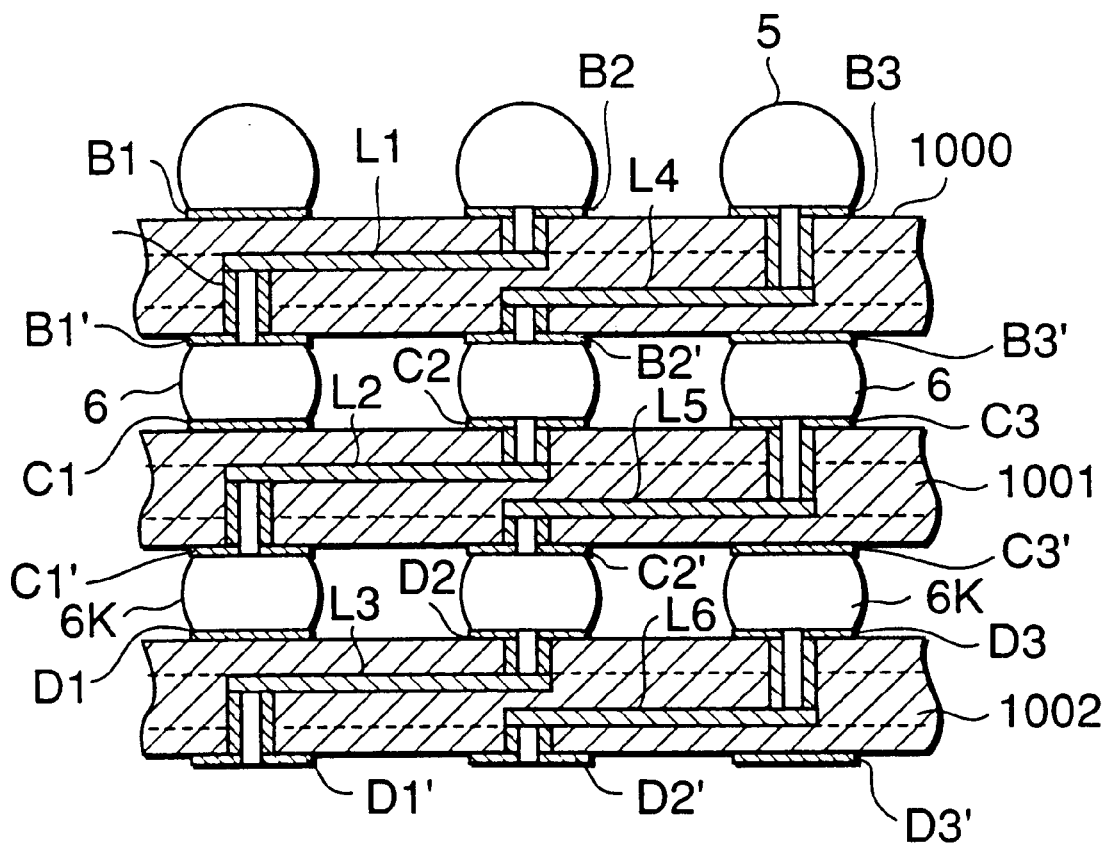
FIG. 5 is a partial sectional view showing a second embodiment of a stacked module according to the present invention.

FIG. 5 is a sectional view showing a second embodiment in which a three-layer substrate is used. However, FIG. 5 shows a section of only a chip select electrode pad part. The wiring structure of the other electrode pads is approximately the same as that in the first embodiment, so the illustration and description are omitted.

In the FIG. 5, all of substrates 1000, 1001, 1002 on which a semiconductor chip (omitted in FIG. 6) is mounted have the same wiring structure. Chip select electrode pads B1 to B3, C1 to C3, D1 to D3 are formed on the surfaces of the substrates 1000, 1001, 1002. Further on the back sides thereof, electrode pads B1' to B3', C1' to C3', D1' to D3' are similarly formed.

Among the above chip select electrode pads, the endmost chip select electrode pads B1, C1, and D1 positioned at the left end are connected to the chip select terminals (RAS terminal of DRAM chip) of the semiconductor chips of the respective layers. Conductive bumps 5, 6, 6K are formed on separate electrode pads connected to the electrode pads B1 to B3, C1 to C3, D1 to D3 similarly to the first embodiment.

The chip select electrode pads B2 and C1 are connected to each other through an internal conductive layer L1, via hole internal electrodes at both ends thereof, and a conductive bump 6, and the chip select electrode pads B3 and D1 are connected to each other through an internal conductive layer L4, via hole internal electrodes at both ends thereof, a conductive bump 6, an electrode pad C2, an internal conductive layer L2 and a conductive bump 6K.

The respective internal conductive layers L1 to L6 are extended independently of each other toward the chip select electrode pads C1, D1 connected to the chip select terminal (RAS terminal of DRAM chip) of the semiconductor chip.

Accordingly, the chip select electrode pads B1, B2 and B3 are individually connected to the chip select terminal (RAS terminal) of the semiconductor chip of the substrate of each layer. Moreover, the wiring structure is the same in the respective substrates. The internal conductive layers L3, L5, L6 are not used in the case of FIG. 5.

In the first and second embodiments of stacked modules, the substrate is two-layer or three-layer, but in the case of performing chip select for N-number (N is integers) of semiconductor chips, a substrate of N-layer structure is used. In this case, the number of chip select electrode pads is N equal to that of the semiconductor chips, the respective chip select electrode pads are connected through internal wiring of the substrate and conductive bumps between the upper and lower substrates to the chip select terminal (e.g. RAS terminal of DRAM) of one semiconductor chip to be selected.

To be concrete, in a stacked module formed by stacking N-layers, electrodes (electrode pads and through-hole internal electrodes) vertically piercing the substrates to be connected to each other and N-number of chip select electrode pads are formed on the surfaces of the respective substrates. A first chip select electrode pad on the surface of the substrate of the i-th layer ($1 \leq i < N$, i is integers) from above is connected to a second chip select electrode pad positioned on the opposite surface side of the adjacent chip select electrode pad. This connection is performed through an internal conductor (conductive layer). In this case, the internal conductor is formed toward the direction in which the first chip select electrode pad connected to the chip select terminal of the semiconductor device is positioned. Further, the second chip select electrode pad is connected to a chip select electrode pad on the surface of the substrate of the (i+1)-th layer from above through a conductive bump. Thus, the substrates of the same wiring structure can be used for N-layers.

Figure 6:
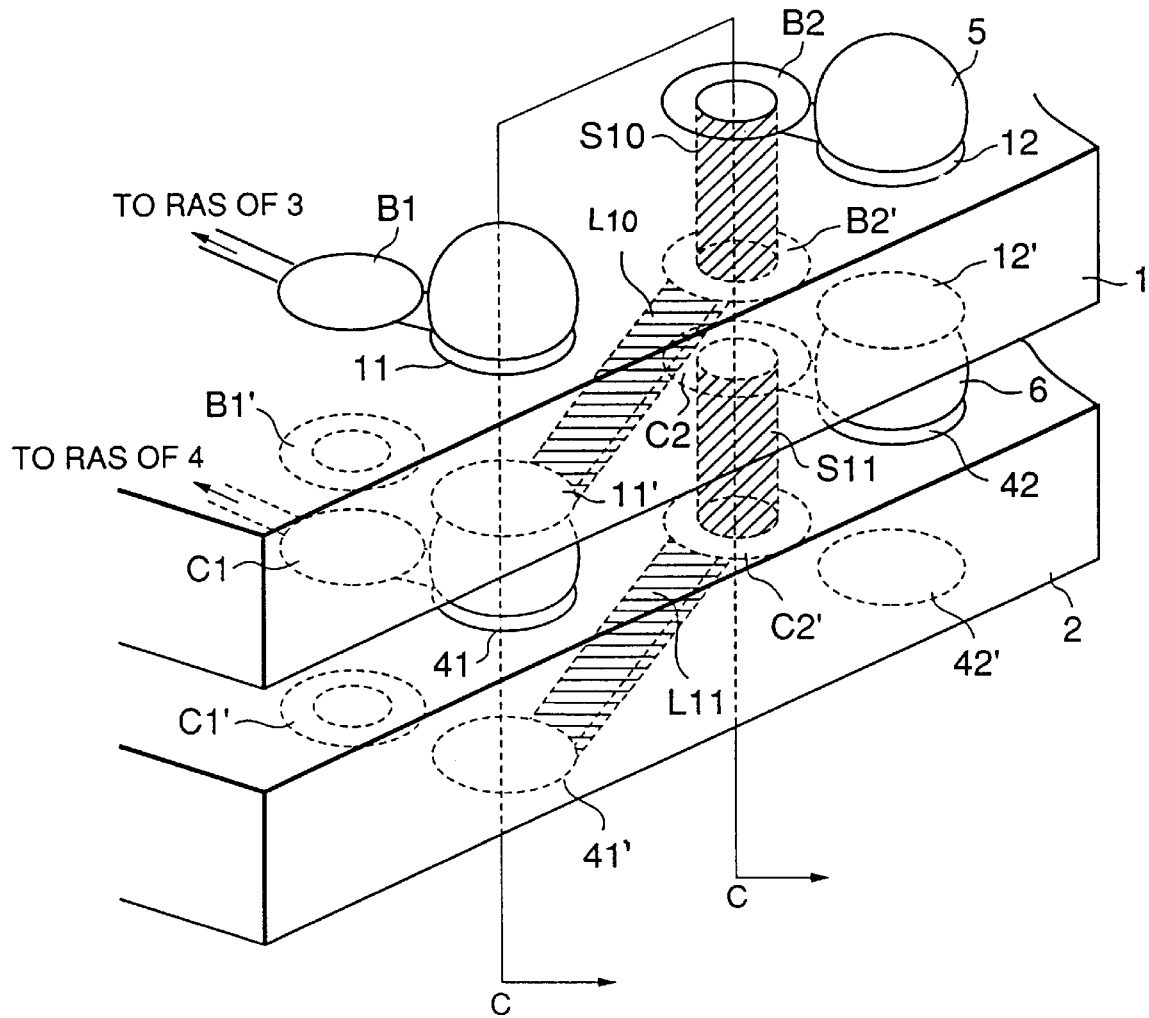
FIG. 6 is a partial perspective view showing a third embodiment of a stacked module according to the present invention.
Figure 7:
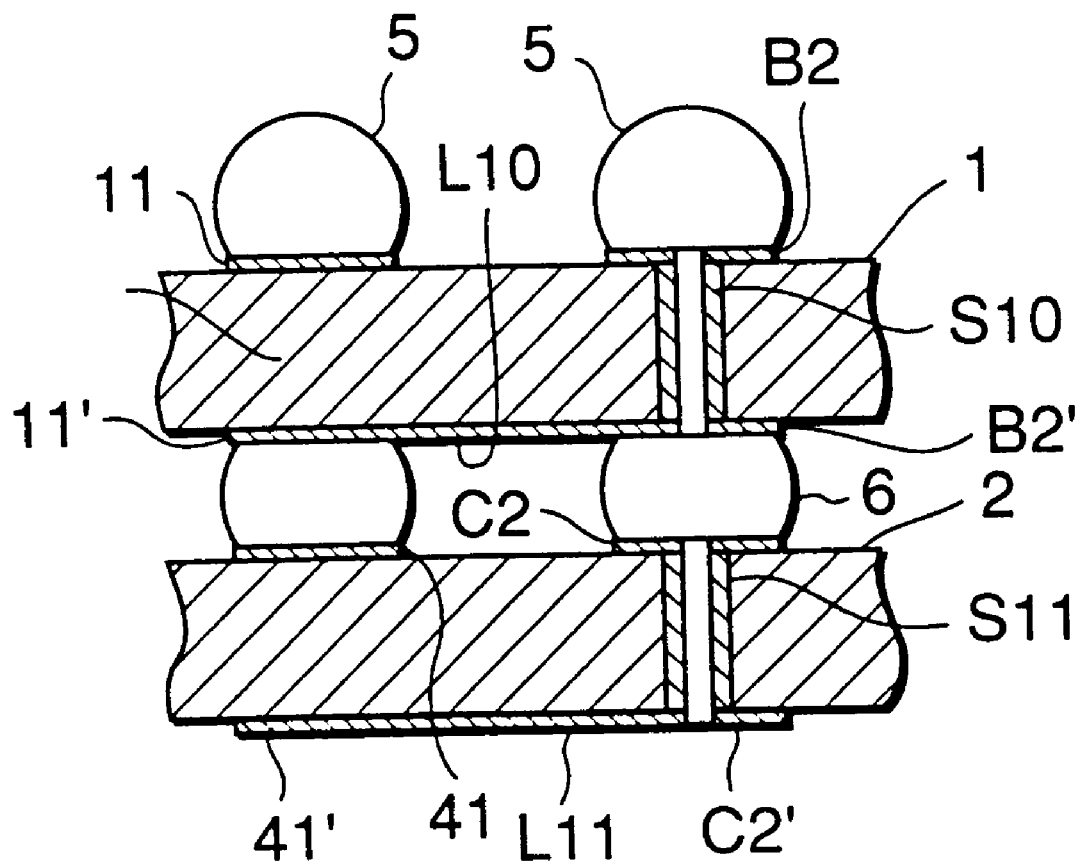
FIG. 7 is a sectional view taken along line C—C of FIG. 6.

FIG. 6 is a partial perspective view showing a third embodiment of a stacked module according to the present invention, and FIG. 7 is a sectional view taken along line C—C of FIG. 6. In the present embodiment, back conductive layers L10, L11 are formed on the back sides of the substrates 1, 2 instead of the internal conductive layers L1 and L2 in the embodiment shown in FIGS. 3 and 4.

No through-hole and via hole are not formed between the chip select electrode pad B1 (C1) and the electrode pad B1' (C1') on the back side thereof. The electrode pads B1' and 11', B2' and 12', C1' and 41', C2' and 42' are not connected with each other.

The chip select electrode pad B1 is connected to the chip select terminal of the semiconductor chip of the substrate 1. The chip select electrode pad B2 is connected through the through-hole internal electrode S10 to the electrode pad B2' on the back side. The electrode pad B2' is further connected to the chip select terminal of the semiconductor chip of the substrate 2 through a back conductive layer L10, the back electrode pad 11', the conductive bump 6 and the chip select electrode pad C1.

Accordingly, the chip select electrode pads B1, B2 function as chip select external terminals of two semiconductor chips similarly to the first embodiment.

The chip select electrode pad C2 of the substrate 2 is connected through a through-hole internal electrode S11 to an electrode pad C2' on the back side, and further connected from the back conductive layer L11 to the back electrode pad 41', but this connecting path is not used for chip select.

In the case of stacked modules shown in FIGS. 6 and 7, it is possible to connect three or more layers of substrates to each other. In this stacked module, a conductive layer is not formed in the substrate, so it is not necessary to form a substrate of a multi-layer structure, resulting in the advantage that the substrate can be formed at a low cost and is not increased in thickness.

Figure 8:
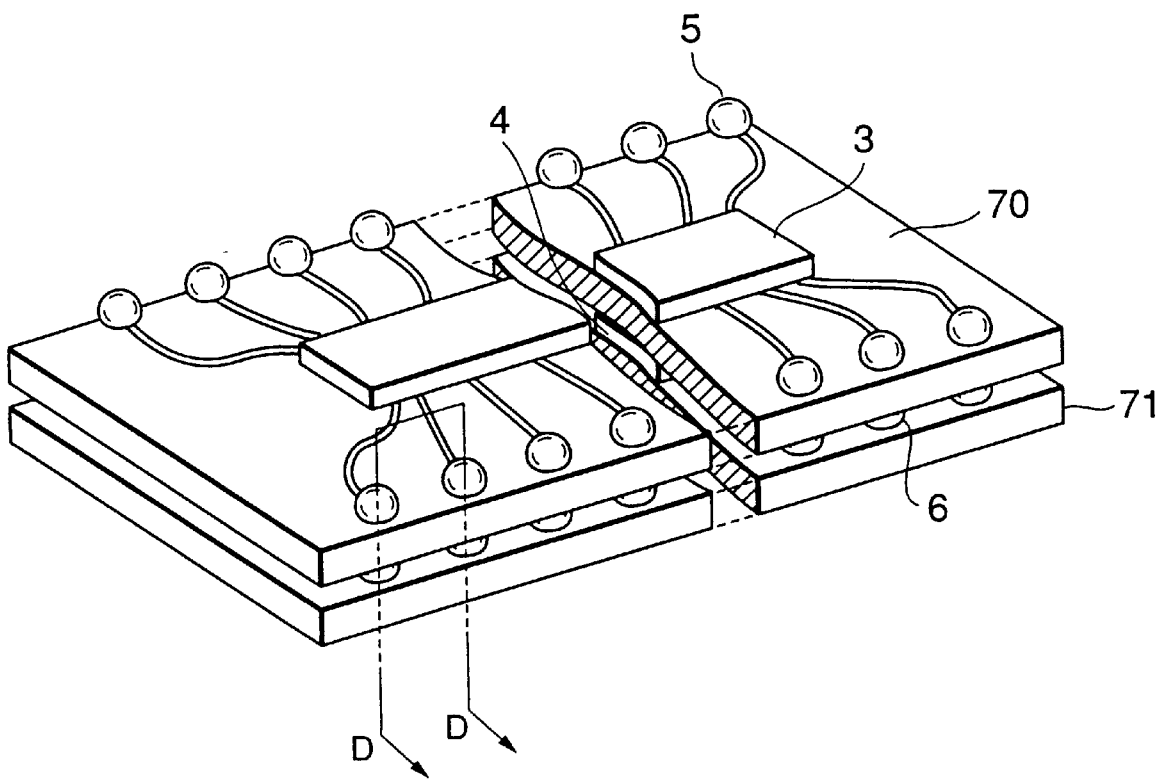
FIG. 8 is a perspective view, with portions broken away, showing a fourth embodiment of a stacked module according to the present invention.
Figure 9:
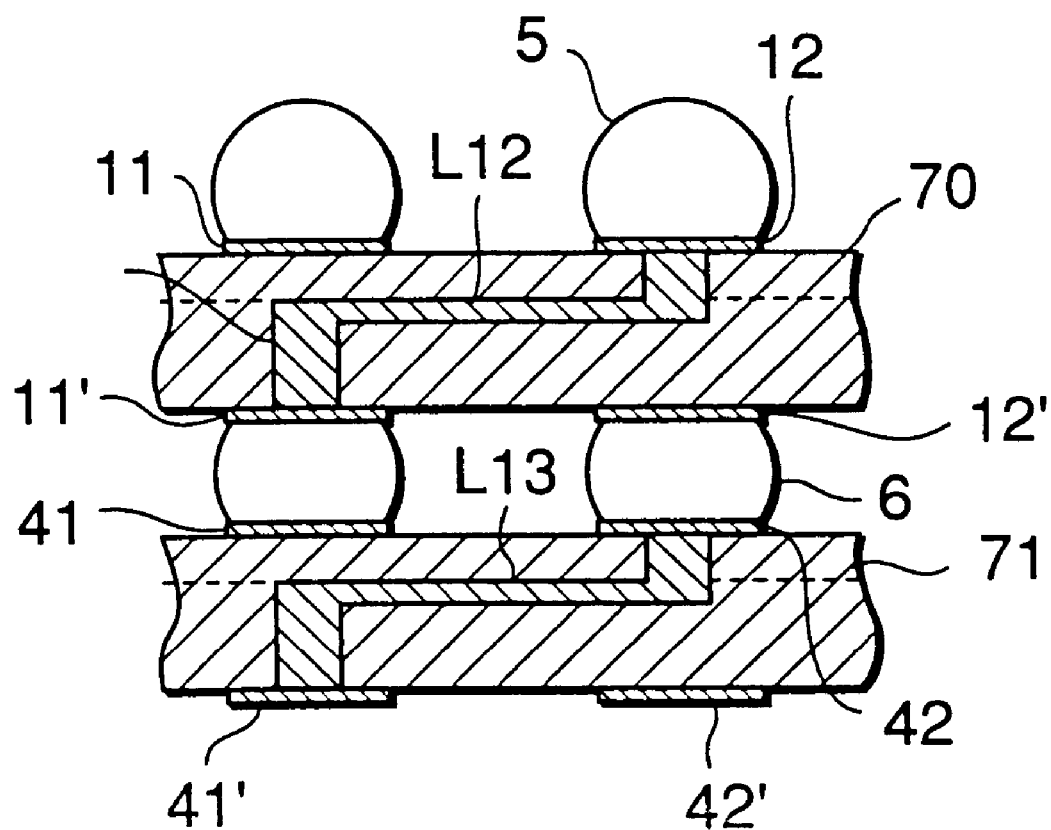
FIG. 9 is a sectional view taken along line D—D of FIG. 8.

FIG. 8 is a perspective view showing a fourth embodiment of a stacked module according to the present invention, and FIG. 9 is a sectional view taken along line D—D of FIG. 8. The stacked module shown in FIG. 8 is so constructed that the same functions as those of the electrode pads B1 to B34 and C1 to C34 shown in FIG. 1 are joined with the electrode pads where the conductive bumps 5, 6 are formed.

In FIG. 9, electrode pads 11, 12 on the surface of a substrate 70 on which a semiconductor chip 3 is mounted, and electrode pads 41, 42 on the surface of a substrate 71 on which a semiconductor chip 4 is mounted are chip select electrode pads. The other electrode pads are vertically connected to each other through a conductor piercing through the substrates 70, 71.

The internal conductors L12, L13 play a part instead of the internal conductive layers Li, L2 of FIG. 4. In FIG. 4, connection between the chip select electrode pad and the internal conductive layer is performed by the via hole internal electrode, but in FIG. 9, the via hole is filled up with internal conductors L12, L13.

In the present embodiment, no holes such as a via hole and a through-hole are formed in the electrode pads where the conductive bumps 5, 6 are formed, so that the conductive bumps 5, 6 can be formed directly on the electrode pad surface so as to reduce the number of the electrode pads.

The stacked module of the present invention is not limited to the described embodiments. For example, a semiconductor device mounted on a substrate is not limited to a base chip of a semiconductor, but it may be a semiconductor package packaged by resin or ceramics.

Though the semiconductor chip 3 is mounted on a surface where the conductive bump 5 is formed in FIG. 1, the semiconductor chip 3 may be mounted on the opposite side to the surface. Further, the chip select electrode pads may be positioned in any place if only they are adjacent to each other. For example, the chip select electrode pads may be formed in the positions of the electrode pads B3, B4.

In the embodiments of the present invention, it will be sufficient that first chip select electrodes (e.g. B1 and 11, C1 and 42) positioned at the endmost among N-number of chip select electrodes are connected to chip select terminals of the mounted semiconductor device (3 in FIG. 1), and the other chip select electrodes (B2 and 12 in FIG. 3) are the opposite surface side electrodes (B1' and 11' in FIG. 3) positioned on the opposite surface side of the adjacent chip select electrode confronting with the first chip select electrodes. Further it will be sufficient that the opposite surface side electrodes and the chip select electrodes (C1 and 41 in FIG. 3) of the substrate (2 in FIG. 3) confronting therewith are connected to each other by the conductive bump (6 in FIG. 3).

In this case, the chip select electrode may be an electrode pad or an electrode pin. In the case of the electrode pin, a conductive bump is not needed. Furthermore, a conductive line other than the electrode pin may be all right.

In the embodiments of the present invention, the other chip select electrodes and the opposite surface side electrodes positioned on the opposite surface side of the adjacent chip select electrode in the direction of the chip select electrode are connected to each other by conductors (e.g. L1, S1, S2 in FIG. 3) arranged in the interior of the substrate. The conductors may have any shape.

According to the present invention, as described above, it will be apparent that as all of the substrates have the quite same wiring structure, the productivity is high and the yield can be improved. Furthermore, even if the positions of the substrates 1, 2 are inverted, the function will not be changed, so that it is not necessary to replace a stacked module and the economical efficiency can be improved.

What is claimed is:

1. A stacked module, formed by stacking N-layers (N is an integer from 2 up) of substrates where a semiconductor device having a chip select terminal to be selected according to an external signal is mounted on each of the stacked N-layers of substrates and connecting upper surface terminals and lower surface terminals between two substrates, characterized in that all of said substrates have the same wiring structure, each of said substrates includes N-number of chip select electrodes arranged adjacent to each other, a first chip select electrode among N-number of said chip select electrodes on a substrate is connected to a chip select terminal of said mounted semiconductor device, the other chip select electrodes on said substrate are connected to opposite surface side electrodes positioned on an opposite surface side of said substrate, said opposite surface side electrodes being positioned opposite to an adjacent chip select electrode which is located in a direction of said first chip select electrode, and said opposite surface side electrodes on said substrate and chip select electrodes on a surface side of a substrate confronted therewith are connected to each other.

2. The stacked module as claimed in claim 1, wherein said first chip select electrode is an electrode positioned at the endmost among N-number of said chip select electrodes.

3. The stacked module as claimed in claim 2, wherein said other chip select electrodes and said opposite surface side electrodes are connected to each other by conductors arranged in an interior of said substrates.

4. The stacked module as claimed in claim 2, wherein said other chip select electrodes and said opposite surface side electrodes are connected to each other by conductors formed on said opposite surface side of said substrates.

5. The stacked module as claimed in claim 2, wherein said opposite surface side electrodes and said chip select electrodes of said substrate confronted therewith are connected to each other by conductive bumps.

6. The stacked module as claimed in claim 1, wherein said substrates include electrodes connected to terminals other than said chip select terminals of said semiconductor device and vertically pierced through said substrates, and said piercing electrodes are connected to each other through conductive bumps between the respective substrates.

7. A stacked module, formed by stacking first and second substrates where a semiconductor device having a chip select terminal to be selected according to an external signal is mounted on each of the first and second substrates and connecting upper surface terminals and lower surface terminals between said first and second substrates, characterized in that said first and second substrates have the same wiring structure, said first substrate includes chip select electrodes arranged adjacent to each other, one chip select electrode is connected to a chip select terminal of said semiconductor device, the other chip select electrode is pierced through said first substrate to reach an opposite surface side and then connected to an opposite surface side electrode positioned on the opposite surface side of said one chip select electrode through a conductor, and said opposite surface side electrode and said chip select electrode of said second substrate confronted therewith are connected to each other by a conductive bump.

8. A stacked module formed by stacking N-layers (N is an integer from 2 up) of substrates on which a semiconductor device having chip select terminals to be selected according to an external signal is mounted, characterized in that each of said substrates includes N-number (N is an integer from 2 up) of chip select electrodes, a first chip select electrode among N-number of said chip select electrodes is connected to the chip select terminal of said semiconductor device, and the other chip select electrodes are connected to opposite surface side electrodes positioned on an opposite surface side of an adjacent chip select electrode in a direction of said first chip select electrode.

9. The stacked module claimed in claim 8, wherein said first chip select electrode is an electrode positioned at the endmost among N-number of said chip select electrodes.

10. The stacked module claimed in claim 8, wherein said other chip select electrodes and said opposite surface side electrodes are connected to each other by conductors arranged in the interior of said substrates.

11. The stacked module claimed in claim 8, wherein said other chip select electrodes and said opposite surface side electrodes are connected to each other by conductors formed on said opposite surface side of said substrates.

* * * * *